US008372488B2

(12) United States Patent
Annigeri et al.

(10) Patent No.: US 8,372,488 B2
(45) Date of Patent: Feb. 12, 2013

(54) METHODS AND APPARATUS FOR THERMAL BARRIER COATINGS WITH IMPROVED OVERALL THERMAL INSULATION CHARACTERISTICS

(75) Inventors: Ravindra Annigeri, Roswell, GA (US); David Vincent Bucci, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 1695 days.

(21) Appl. No.: 11/381,007

(22) Filed: May 1, 2006

(65) Prior Publication Data

US 2007/0254181 A1 Nov. 1, 2007

(51) Int. Cl.

| | |
|---|---|
| ***C23C 4/06*** | (2006.01) |
| ***C23C 4/12*** | (2006.01) |
| ***C23C 14/00*** | (2006.01) |
| ***B05D 1/36*** | (2006.01) |

(52) U.S. Cl. ........ 427/456; 427/454; 427/455; 427/585; 427/255.7; 427/250; 427/405; 427/419.3

(58) Field of Classification Search .................. 427/454, 427/456

See application file for complete search history.

(56) References Cited

U.S. PATENT DOCUMENTS

| | | | | |
|---|---|---|---|---|
| 4,926,020 | A * | 5/1990 | Atwell et al. | 219/729 |
| 5,238,752 | A | 8/1993 | Duderstadt et al. | |
| 5,384,200 | A | 1/1995 | Giles et al. | |
| 5,645,893 | A | 7/1997 | Rickerby et al. | |
| 5,763,107 | A | 6/1998 | Rickerby et al. | |
| 6,001,492 | A | 12/1999 | Jackson et al. | |
| 6,042,951 | A | 3/2000 | Kojima et al. | |
| 6,123,997 | A | 9/2000 | Schaeffer et al. | |
| 6,352,788 | B1 | 3/2002 | Bruce | |
| 6,487,518 | B1 * | 11/2002 | Miyazaki et al. | 702/170 |
| 6,521,293 | B1 | 2/2003 | Kojima et al. | |
| 6,887,595 | B1 * | 5/2005 | Darolia et al. | 428/701 |
| 2003/0138658 | A1 * | 7/2003 | Taylor et al. | 428/632 |
| 2004/0126599 | A1 * | 7/2004 | Wigren et al. | 428/472 |
| 2005/0260434 | A1 | 11/2005 | Nelson et al. | |

* cited by examiner

*Primary Examiner* — Katherine A Bareford
(74) *Attorney, Agent, or Firm* — Armstrong Teasdale LLP

(57) ABSTRACT

Methods and apparatus for thermal barrier coatings are provided. The thermal barrier coating system includes a bond coat, a first thermal barrier coating comprising a thermal conductivity, $k_A$ having a first value, and a second thermal barrier coating including a thermal conductivity, $k_B$ having a second value wherein the second value is different than the first value.

9 Claims, 5 Drawing Sheets

METHODS AND APPARATUS FOR THERMAL BARRIER COATINGS WITH IMPROVED OVERALL THERMAL INSULATION CHARACTERISTICS

BACKGROUND OF THE INVENTION

This invention generally relates to coating systems for protecting metal substrates. More specifically, the invention is directed to a thermal barrier coating with improved overall thermal insulation characteristics.

Thermal barrier coatings (TBC) are used on gas turbine engine components such as buckets, nozzles, shrouds. A typical TBC is expected to protect substrate materials against hostile corrosion and oxidation environments found in gas turbine engines. The thermal conductivity properties of at least some known ceramic TBC are an order of magnitude lower than typical nickel-based and cobalt-based superalloys. The thickness of TBC can be tailored to achieve a desired level of thermal resistance, i.e. required temperature drop across a TBC system. Therefore, a TBC forms a thermal barrier to heat flow, reducing a cooling requirement to the substrate and increasing thermal efficiency. Additionally, the TBC can be used to enhance durability of substrate by decreasing operating temperature, which may decrease susceptibility to creep and low cycle fatigue (LCF) failures in coated components.

The application of TBC on modern gas turbine components includes a coating of predetermined thickness to achieve a desired thermal insulation. Thermal insulation is a function of the TBC thickness and the TBC conductivity. The lower the thermal conductivity, the higher is the insulation capability of a TBC of specified thickness. Therefore, by decreasing conductivity of conventional TBCs, it is possible to achieve higher thermal insulation to gas turbine components. A reduced amount of coating thickness by decreasing conductivity of the TBC provides manufacturing cost savings.

BRIEF DESCRIPTION OF THE INVENTION

In one embodiment, a (TBC) includes a bond coat, a first TBC comprising a thermal conductivity, $k_A$ having a first value, and a second TBC including a thermal conductivity, $k_B$ having a second value wherein the second value is different than the first value.

In another embodiment, a method of protecting a surface of a substrate includes applying a bond coat onto the surface of the substrate, applying a first TBC comprising a thermal conductivity $k_A$ having a first value over at least a portion of the bond coat, and applying a second TBC comprising a thermal conductivity $k_B$ having a second value over at least a portion of the first TBC wherein the second value is different than the first value.

In yet another embodiment, a turbine engine component includes a metal substrate, and a plurality of TBCs, each coating comprising a respective thermal conductivity value wherein each respective value is different than each other value.

DETAILED DESCRIPTION OF THE INVENTION

Figure 1:
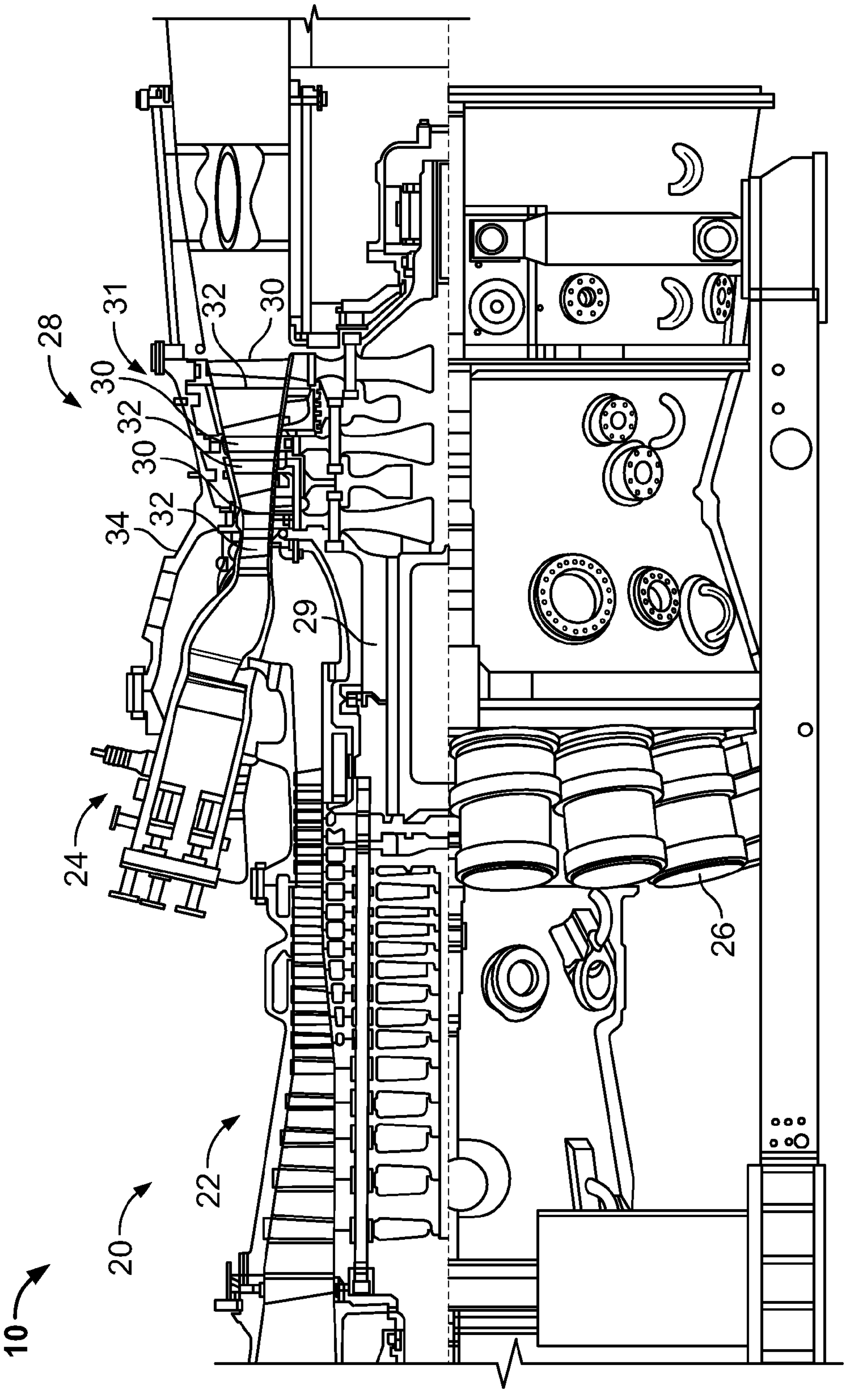
FIG. 1 is a side cutaway view of a gas turbine system.

FIG. 1 is a side cutaway view of a gas turbine system 10 that includes a gas turbine 20. Gas turbine 20 includes a compressor section 22, a combustor section 24 including a plurality of combustor cans 26, and a turbine section 28 coupled to compressor section 22 using a shaft 29. A plurality of turbine blades 30 are connected to turbine shaft 29. Between turbine blades 30 there is positioned a plurality of non-rotating turbine nozzle stages 31 that include a plurality of turbine nozzles 32. Turbine nozzles 32 are connected to a housing or shell 34 surrounding turbine blades 30 and nozzles 32. Hot gases are directed through nozzles 32 to impact blades 30 causing blades 30 to rotate along with turbine shaft 29.

In operation, ambient air is channeled into compressor section 22 where the ambient air is compressed to a pressure greater than the ambient air. The compressed air is then channeled into combustor section 24 where the compressed air and a fuel are combined to produce a relatively high-pressure, high-velocity gas. Turbine section 28 is configured to extract the energy from the high-pressure, high-velocity gas flowing from combustor section 24. Gas turbine system 10 is typically controlled, via various control parameters, from an automated and/or electronic control system (not shown) that is attached to gas turbine system 10.

Figure 2:
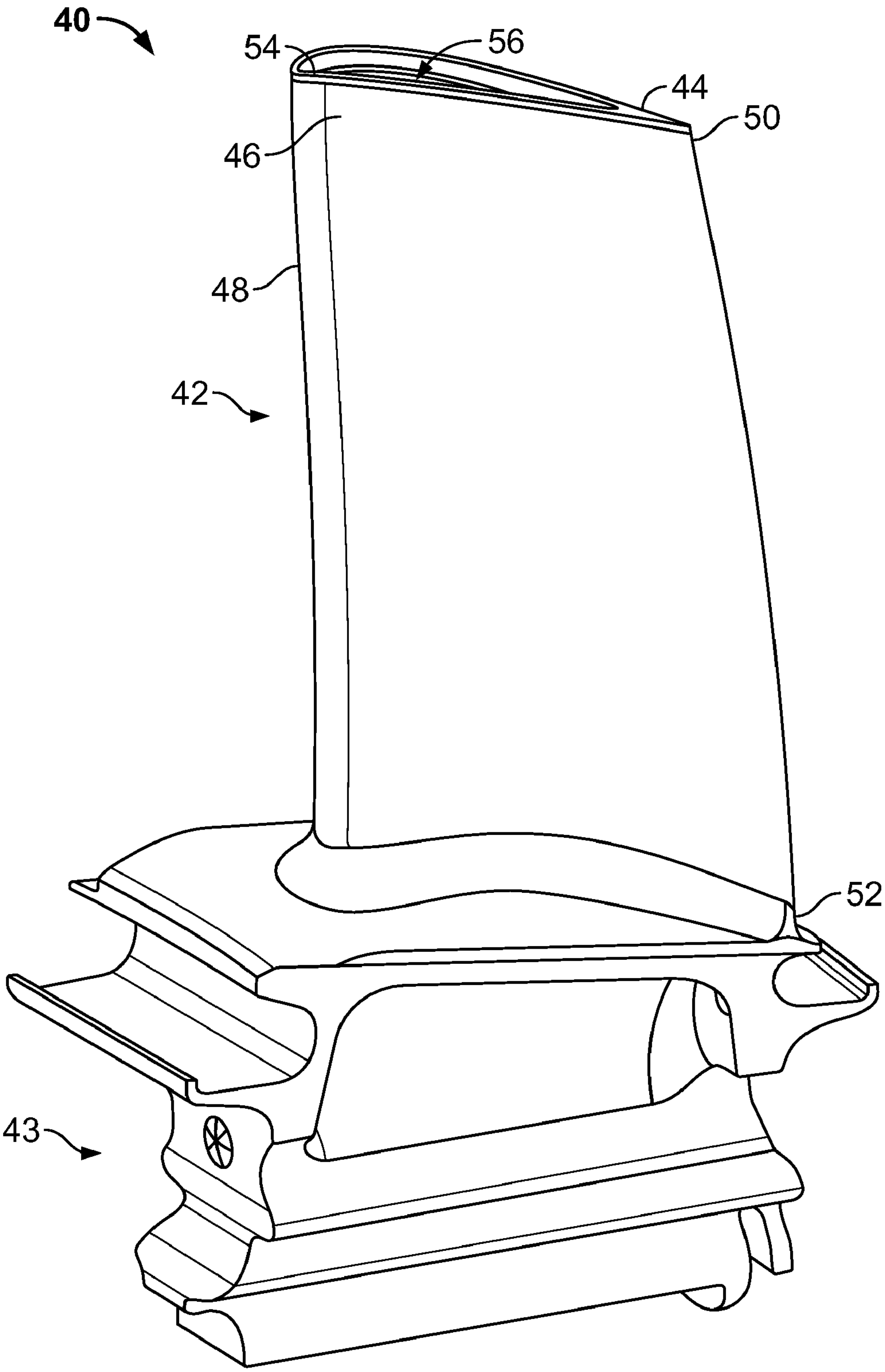
FIG. 2 is a perspective schematic illustration of a rotor blade that may be used with the gas turbine engine (shown in FIG. 1)

FIG. 2 is a perspective schematic illustration of a rotor blade 40 that may be used with gas turbine engine 20. In an exemplary embodiment, a plurality of rotor blades 40 form a high pressure turbine rotor blade stage (not shown) of gas turbine engine 20. Each rotor blade 40 includes a hollow airfoil 42 and an integral dovetail 43 used for mounting airfoil 42 to a rotor disk (not shown) in a known manner.

Airfoil 42 includes a first sidewall 44 and a second sidewall 46. First sidewall 44 is convex and defines a suction side of airfoil 42, and second sidewall 46 is concave and defines a pressure side of airfoil 42. Sidewalls 44 and 46 are connected at a leading edge 48 and at an axially-spaced trailing edge 50 of airfoil 42 that is downstream from leading edge 48.

First and second sidewalls 44 and 46, respectively, extend longitudinally or radially outward to span from a blade root 52 positioned adjacent dovetail 43 to a top plate 54 which defines a radially outer boundary of an internal cooling circuit or chamber 56.

Figure 3:
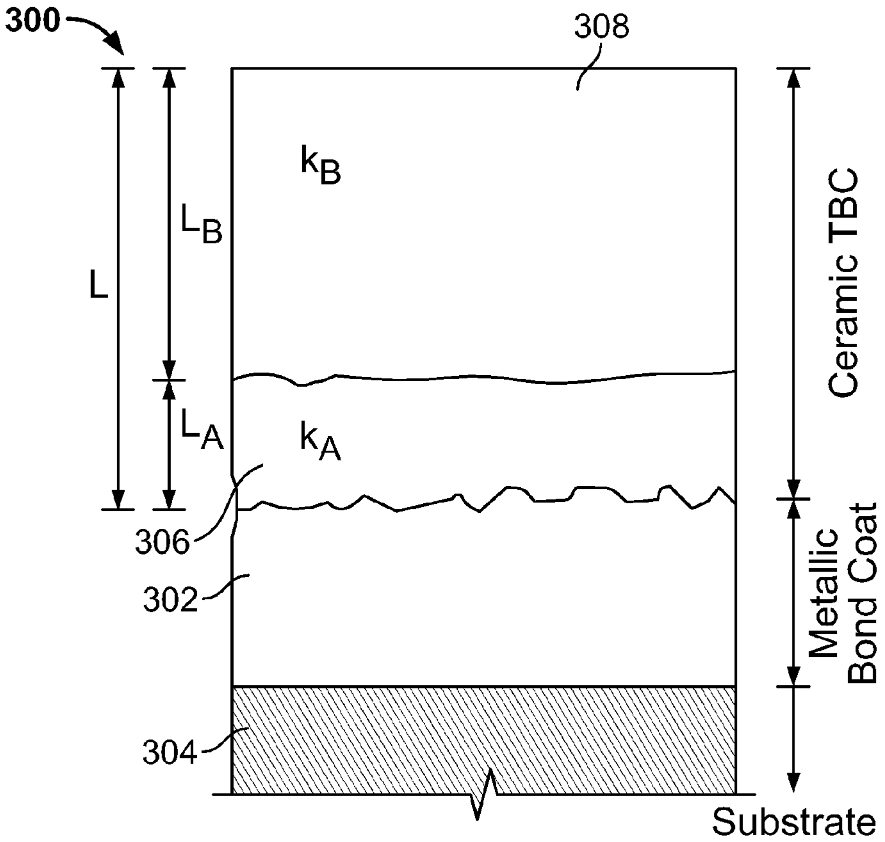
FIG. 3 is a schematic cross-sectional view of an exemplary multi-layered thermal barrier coating (TBC) system in accordance with an embodiment of the present invention.

FIG. 3 is a schematic cross-sectional view of an exemplary multi-layered thermal barrier coating (TBC) system 300 in accordance with an embodiment of the present invention. TBC system 300 includes a bond coat covering at least a portion of a metallic substrate 304. In the exemplary embodiment, a first TBC 306 covers at least a portion of bond coat 302. TBC 306 comprises a ceramic mixture having a thermal conductivity value $k_A$, and a thickness $L_A$. A second TBC 308 covers at least a portion of TBC 306. TBC 308 comprises a ceramic mixture having a thermal conductivity value $k_B$, and a thickness $L_B$. Although only two distinct TBC coatings are shown in FIG. 3, it should be understood that more than two distinct coatings with respective different thermal conductivities are contemplated. A total TBC system thickness L includes the thicknesses of all the thermal barrier coatings used in TBC system 300.

An overall thermal conductivity of multi-layer TBC system 300 is calculated using:

$$k \approx \frac{(L_A + L_B)}{\left(\frac{L_A}{k_A} + \frac{L_B}{k_B}\right)} \quad (1)$$

where, $L_A$ is a thickness of TBC with a thermal conductivity, $k_A$ and $L_B$ is a thickness of TBC with a thermal conductivity of $k_B$. Although, in some cases it is desirable to produce TBC system 300 with substantially equal individual coating thickness (i.e. $L_A=L_B$), an overall thickness reduction of TBC system 300 is achieved by controlling a ratio of $L_B/L_A$.

Figure 4:
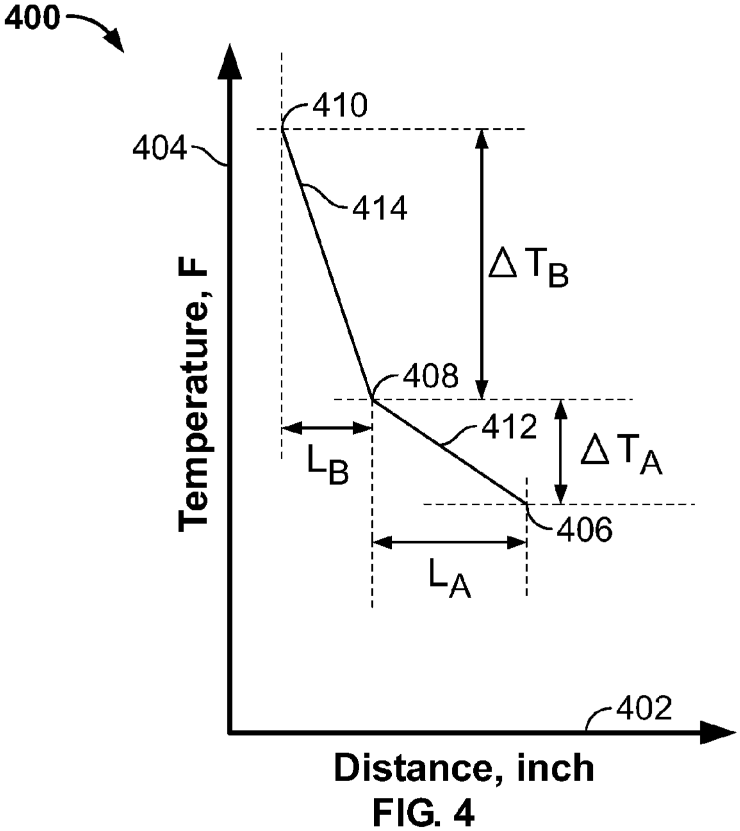
FIG. 4 is a graph of a trace illustrating an exemplary thermal conductivity curve that corresponds to TBC system shown in FIG. 3.

FIG. 4 is a graph 400 of a trace 402 illustrating an exemplary thermal conductivity curve that corresponds to TBC system 300 (shown in FIG. 3). Graph 400 includes an x-axis 402 graduated in units of distance, for example, inches of thickness of the corresponding TBCs. Graph 400 includes a y-axis 404 graduated in units of temperature, for example, degrees Fahrenheit, at each point along the thickness of each TBC. A point 406 represents the temperature at the interface between bond coat 302 and first TBC 306. A point 408 represents the temperature at the interface of first TBC 306 and second TBC 308. A point 410 represents the temperature at the surface of TBC 308. A slope of a line 412 between points 406 and 408 represents the thermal conductivity of TBC 306 and a line 414 between points 408 and 410 represents the thermal conductivity of TBC 308.

Figure 5:
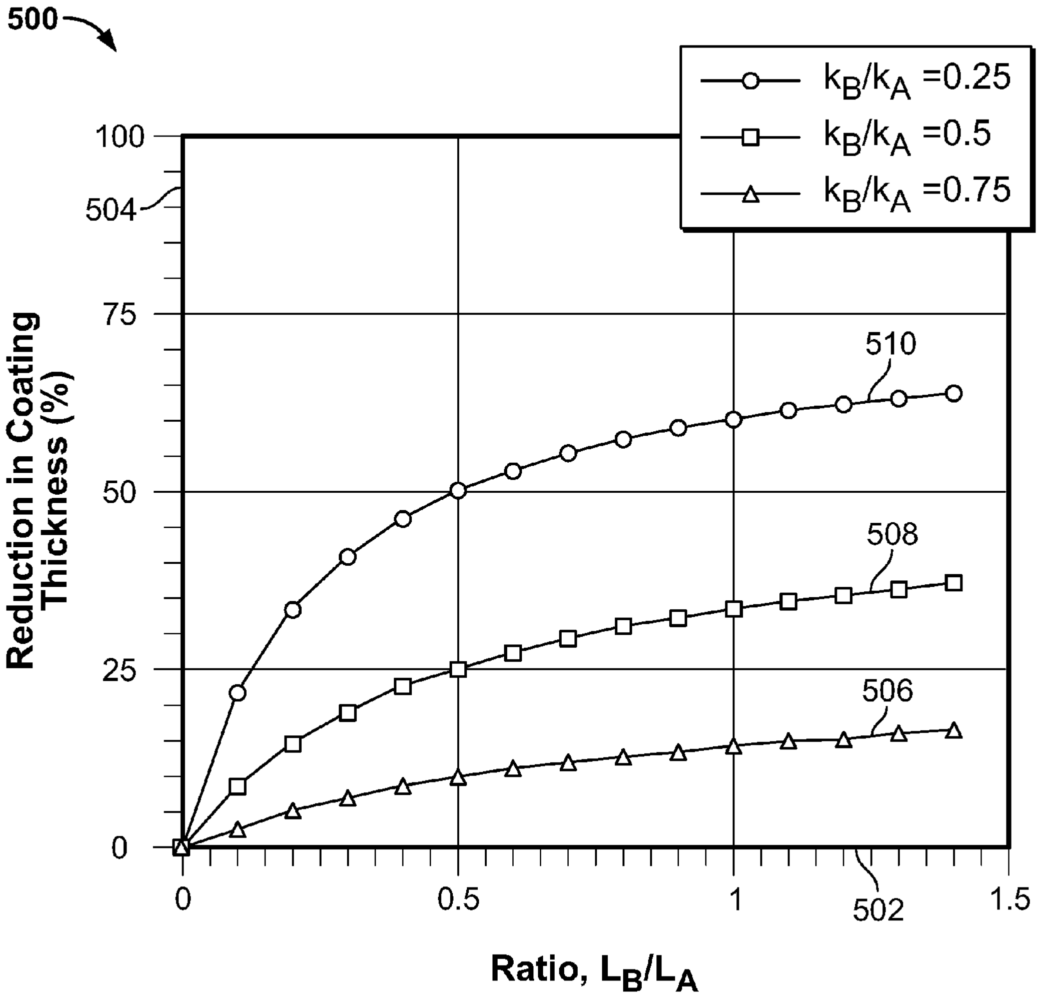
FIG. 5 is a graph of exemplary traces of TBC system thickness reduction.

FIG. 5 is a graph 500 of exemplary traces of TBC system thickness reduction with respect to a plurality of ratios of the thickness of the first and second coatings and ratio of the thermal conductivity of each respective coating. Graph 500 includes an x-axis 502 graduated in units of ratio of $L_B/L_A$. Graph 500 also includes a y-axis 504 graduated in units of a percent of reduction in TBC system thickness. A trace 506 illustrates results of percent of reduction in TBC system thickness when coatings having a ratio of thermal conductivity of $k_B/k_A$ wherein $k_B/k_A=0.75$ are used. A trace 508 illustrates results of percent of reduction in TBC system thickness when coatings having a $k_B/k_A=0.5$ are used, and a trace 510 illustrates results of percent of reduction in TBC system thickness when coatings having a $k_B/k_A=0.25$ are used.

Traces 506, 508, and 510 can be calculated using equation 2 for any combination of coating thicknesses and coating thermal conductivity.

$$\text{\% Reduction in TBC Thickness} \approx \left[1 - \frac{1 + \left(\frac{L_B}{L_A}\right)}{1 + \frac{\left(\frac{L_B}{L_A}\right)}{\left(\frac{k_B}{k_A}\right)}}\right] 100 \quad (2)$$

Figure 6:
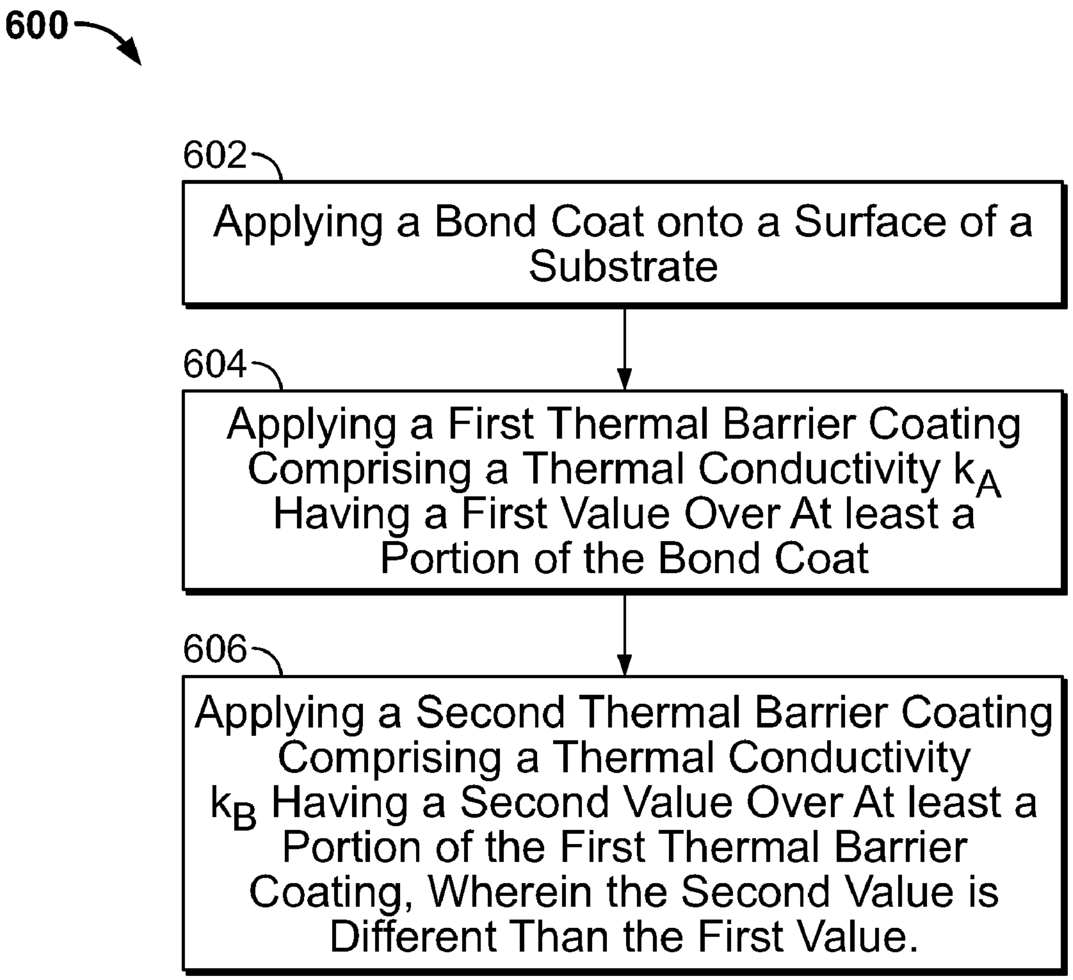
FIG. 6 is a flow chart of an exemplary method of protecting a surface of a substrate.

FIG. 6 is a flow chart of an exemplary method 600 of protecting a surface of a substrate. The method includes applying 602 a bond coat onto the surface of the substrate. In the exemplary embodiment, the bond coat comprises MCrAlY wherein M comprises at least one of Ni, Co, and Fe. The bond coat may be applied using an air plasma spray (APS), a low pressure plasma spray (LPPS), a high velocity oxy fuel (HVOF) process, a electron beam physical vapor deposition (EB-PVD), another process or a combination thereof. Method 600 also includes applying 604 a first TBC comprising a thermal conductivity $k_A$ having a first value over at least a portion of the bond coat. In the exemplary embodiment, first TBC comprises a porosity of less than approximately 5.0% and having a columnar microstructure. Method 600 also includes applying 606 a second TBC comprising a thermal conductivity $k_B$ having a second value over at least a portion of the first TBC. In the exemplary embodiment, second TBC comprises a porosity of between approximately 5.0% and approximately 30% and thermal conductivity $k_B$ is smaller than thermal conductivity $k_A$.

The thermal conductivity of the TBC system is determined using:

$$k \approx \frac{(L_A + L_B)}{\left(\frac{L_A}{k_A} + \frac{L_B}{k_B}\right)}, \text{ where}$$

$L_A$ is a thickness of the first TBC, $k_A$ is the thermal conductivity of the first TBC, $L_B$ is a thickness of the second TBC, and $k_B$ is the thermal conductivity of the second TBC.

Although a TBC system where $L_A \approx L_B$ is desirable, a thinner TBC system total thickness is typically cost beneficial. The percent reduction of TBC system thickness is determined using:

$$\text{Percent Reduction in TBC System Thickness} \approx \left[1 - \frac{1 + \left(\frac{L_B}{L_A}\right)}{1 + \frac{\left(\frac{L_B}{L_A}\right)}{\left(\frac{k_B}{k_A}\right)}}\right] 100,$$

where $L_A$ is a thickness of the first TBC, $k_A$ is the thermal conductivity of the first TBC, $L_B$ is a thickness of the second TBC, and $k_B$ is the thermal conductivity of the second TBC.

The above-described TBC system is a cost-effective and highly reliable method for reducing a total thickness of the thermal barrier system and providing a greater overall thermal insulation for a thermal barrier system of a given thickness. The multi-layered coating produces a TBC microstructure of reduced overall conductivity and higher resistance to spallation. Furthermore, the multi-layered TBC facilitates reducing manufacturing costs and increasing durability of coated components due to a decrease in operating stresses (e.g. reduction in weight of coating due to decrease in coating thickness will decrease centrifugal stresses). Accordingly, the multi-layered TBC system facilitates operating gas turbine engine components, in a cost-effective and reliable manner.

While the invention has been described in terms of various specific embodiments, those skilled in the art will recognize that the invention can be practiced with modification within the spirit and scope of the claims.

What is claimed is:

1. A method of coating a surface of a substrate, said method comprising:

applying a bond coat onto the surface of the substrate;

applying a thermal barrier coating (TBC) system over at least a portion of the bond coat, such that the TBC system has a predetermined TBC system thickness;

applying a first TBC comprising a thermal conductivity $k_A$ having a first value over at least a portion of the bond coat, wherein the first TBC is applied with a first thickness $L_A$ ;

applying a second TBC comprising a thermal conductivity $k_B$ having a second value over at least a portion of the first TBC to form the TBC system, wherein the second value is different than the first value, wherein the second TBC is applied with a second thickness $L_B$ that is different than first thickness $L_A$;

determining what a first TBC system thickness for the TBC system would be if the first thickness $L_A$ is substantially equal to second thickness $L_B$;

determining what a first TBC system thermal conductivity value k for the TBC system would be if the first thickness $L_A$ is substantially equal to the second thickness $L_B$ using:

$$k = \frac{(L_A + L_B)}{\left(\frac{L_A}{k_A} + \frac{L_B}{k_B}\right)};$$

using the determined first TBC system thermal conductivity value to select a second thermal conductivity value for the TBC system, wherein the second thermal conductivity value of the TBC system is substantially equal to the determined first TBC system thermal conductivity value; and selecting a thickness $L_A$ and a thickness $L_B$ for the TBC system with the second thermal conductivity value such that the TBC system with the second thermal conductivity value has a second TBC system thickness that is less than the first TBC system thickness and the second TBC system thermal conductivity value remains substantially equal to the first TBC system thermal conductivity value, wherein the TBC system is applied with the first TBC thickness $L_A$ and the second TBC thickness $L_B$ selected for the TBC system with the second thermal conductivity value.

2. A method in accordance with claim 1 wherein applying a bond coat comprises applying a bond coat comprising MCrAlY wherein M comprises at least one of Ni, Co, and Fe.

3. A method in accordance with claim 1 wherein applying a bond coat comprises applying a bond coat using at least one of air plasma spray (APS), low pressure plasma spray (LPPS), high velocity oxy fuel (HVOF) process, and electron beam physical vapor deposition (EB-PVD).

4. A method in accordance with claim 1 wherein applying a bond coat comprises applying a bond coat using at least two of air plasma spray (APS), low pressure plasma spray (LPPS), high velocity oxy fuel (HVOF) process, and electron beam physical vapor deposition (EB-PVD).

5. A method in accordance with claim 1 wherein applying a second TBC comprises applying a second TBC comprising a thermal conductivity $k_B$ having a second value wherein the second value is smaller than the first value.

6. A method in accordance with claim 1 wherein applying a first TBC comprises applying a first TBC having a porosity of less than approximately 5.0%.

7. A method in accordance with claim 1 wherein applying a first TBC comprises applying a first TBC having a columnar microstructure.

8. A method in accordance with claim 1 wherein applying a second TBC comprises applying a second TBC having a porosity of between approximately 5.0% and approximately 30%.

9. A method in accordance with claim 1 further comprising determining a reduction in TBC system thickness when the second TBC system thermal conductivity value is substantially equal to the first TBC system thermal conductivity value using:

$$\text{Percent Reduction in TBC System Thickness} \approx \left[1 - \frac{1 + \left(\frac{L_B}{L_A}\right)}{1 + \frac{\left(\frac{L_B}{L_A}\right)}{\left(\frac{k_B}{k_A}\right)}}\right]100.$$

* * * * *

UNITED STATES PATENT AND TRADEMARK OFFICE

CERTIFICATE OF CORRECTION

PATENT NO. : 8,372,488 B2
APPLICATION NO. : 11/381007
DATED : February 12, 2013
INVENTOR(S) : Annigeri et al.

It is certified that error appears in the above-identified patent and that said Letters Patent is hereby corrected as shown below:

In Column 4, Line 18, in Equation, delete "$k \approx$" and insert -- $k =$ --, therefor.

In Column 4, Line 22, delete "$K_A$is" and insert -- $K_A$ is --, therefor.

In Column 4, Line 41, delete "$L_B$is" and insert -- $L_B$ is --, therefor.

In Column 5, Line 4, in Claim 1, delete "$L_A$ ;" and insert -- $L_A$; --, therefor.

Signed and Sealed this
Second Day of April, 2013

Teresa Stanek Rea
*Acting Director of the United States Patent and Trademark Office*